United States Patent
Verma et al.

(10) Patent No.: US 6,850,123 B1
(45) Date of Patent: Feb. 1, 2005

(54) CIRCUITS AND METHODS FOR CHARACTERIZING THE SPEED PERFORMANCE OF MULTI-INPUT COMBINATORIAL LOGIC

(75) Inventors: Himanshu J. Verma, Mountain View, CA (US); Anthony P. Calderone, Soquel, CA (US); Richard D. Duce, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 72 days.

(21) Appl. No.: 10/447,132

(22) Filed: May 27, 2003

(51) Int. Cl.[7] .............................................. H03B 27/00
(52) U.S. Cl. ................................... 331/57; 331/DIG. 3
(58) Field of Search ............................ 331/57, DIG. 3; 327/161, 153

(56) References Cited

U.S. PATENT DOCUMENTS

| | | | | |
|---|---|---|---|---|
| 3,603,746 A | * | 9/1971 | Heick et al. ............. | 324/76.63 |
| 4,489,272 A | * | 12/1984 | McLeod .................... | 324/73.1 |
| 4,517,532 A | * | 5/1985 | Neidorff ................... | 331/57 |
| 4,792,932 A | * | 12/1988 | Bowhers et al. ........... | 368/113 |
| 5,045,811 A | * | 9/1991 | Lewis ....................... | 331/1 A |
| 5,923,676 A | * | 7/1999 | Sunter et al. ............. | 714/733 |
| 6,075,418 A | | 6/2000 | Kingsley et al. | |
| 6,426,641 B1 | * | 7/2002 | Koch et al. ................ | 324/765 |
| 6,515,549 B2 | * | 2/2003 | Nakano ..................... | 331/57 |
| 2003/0048142 A1 | * | 3/2003 | Albean ...................... | 331/57 |

* cited by examiner

*Primary Examiner*—Benny Lee
*Assistant Examiner*—Joseph Chang
(74) *Attorney, Agent, or Firm*—Arthur J. Behiel; Edel M. Young; Justin Liu (57) ABSTRACT

A test oscillator circuit separately measures the signal propagation delay for both rising and falling edges through one or more multi-input combinatorial logic circuits. A number of components are configured in a loop so that they together form a free-running ring oscillator. Each synchronous component passes signal edges to a subsequent component in the ring, so the oscillator produces an oscillating test signal in which the period relates to the delays through the components. In some embodiments, the multi-input combinatorial logic circuits emulate tri-state buffers. These embodiments characterize the speed at which these logic circuits enable and disable signal paths.

22 Claims, 5 Drawing Sheets

CIRCUITS AND METHODS FOR CHARACTERIZING THE SPEED PERFORMANCE OF MULTI-INPUT COMBINATORIAL LOGIC

BACKGROUND

1. Field of the Invention

This invention relates generally to methods and circuit configurations for measuring response delay times of integrated circuits.

2. Description of the Related Art

Integrated circuits (ICs) are the cornerstones of myriad computational systems, such as personal computers and communications networks. Purchasers of such systems have come to expect significant improvements in speed performance over time. The demand for speed encourages system designers to select ICs that boast superior speed performance. This, in turn, leads IC manufacturers to carefully test the speed performance of their designs.

Figure 1A:
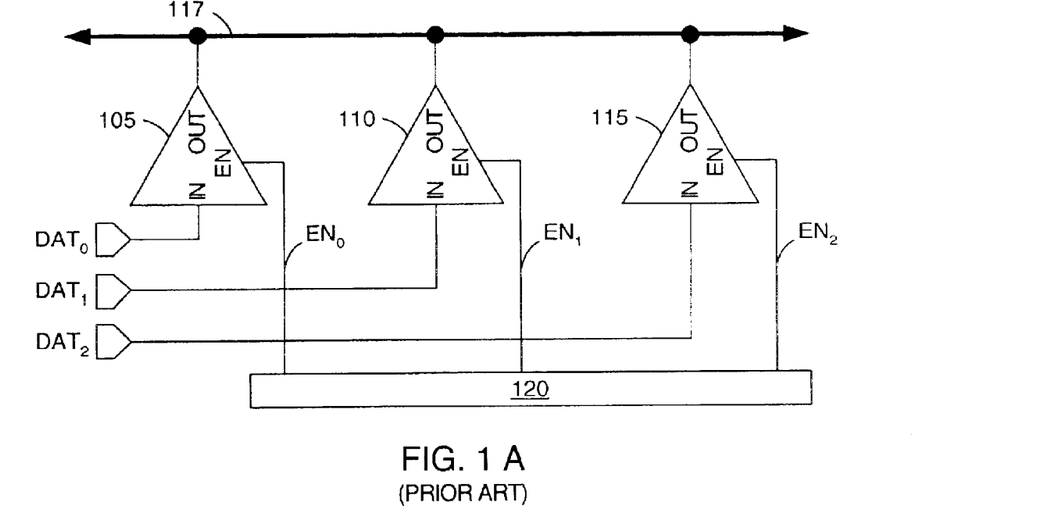
FIG. 1A (prior art) illustrates a bus structure 100 in which a bus line 110 is selectively driven by tri-state buffers.

FIG. 1A (prior art) shows a bus structure 100 in which three tri-state buffers 105, 110, and 115 alternatively drive a bus line 117. A control circuit 120 selectively enables one of the three tri-state buffers to connect one of signal lines DAT0, DAT1, and DAT2 to line 117. The de-selected selected tri-state buffers offer a high impedance to bus line 117, and consequently do not interfere with transmitted signals.

Bus structure 100 is useful for external communication (bus line 117 connects to external devices) in which disabled tri-state buffers driving a bus line have to be tri-stated, but is uneconomical and consumes a considerable amount of die area when implemented within the fabric of an IC for internal communication. Circuit designers have therefore developed smaller, more economical substitutes for bus structure 100.

Figure 1B:
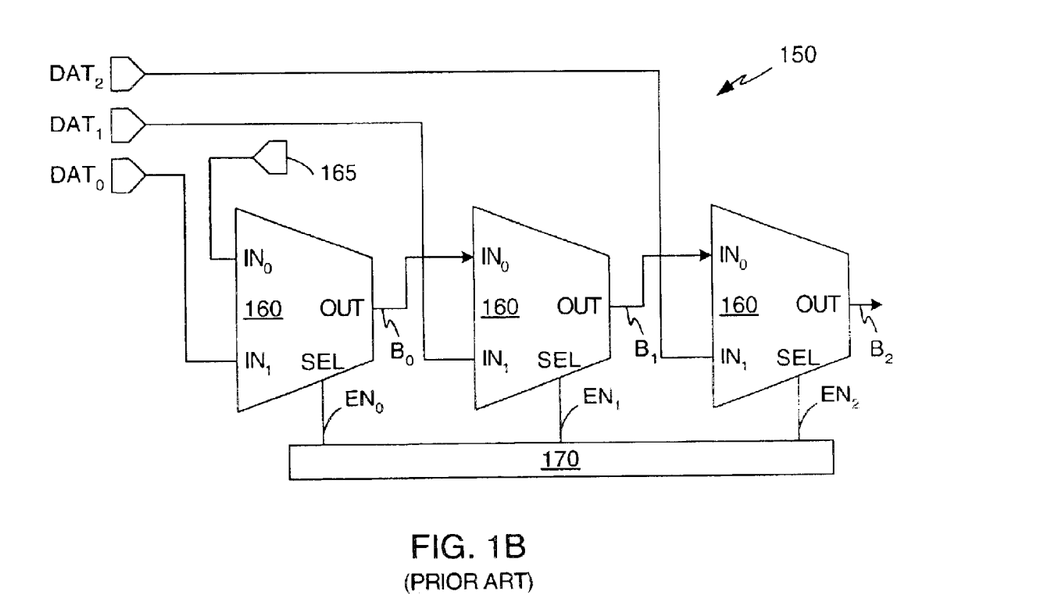
FIG. 1B (prior art) is a schematic diagram of a multiplexer chain 150 implementing a bus structure 100 within the fabric of a programmable logic device.

FIG. 1B (prior art) is a multiplexer chain 150 that implements the function of bus structure 100 of FIG. 1A without some of the drawbacks. Multiplexer chain 150 includes first, intermediate, and last multiplexers 160, each having a first multiplexer input $IN_0$, a second multiplexer input $IN_1$, and a multiplexer control terminal SEL selecting which of the multiplexer inputs is connected to a multiplexer output terminal OUT. The output of the first multiplexer connects to the input $IN_0$ of the intermediate multiplexer via an interconnect $B_0$ and the output of the intermediate multiplexer connects to input $IN_1$ of the final multiplexer via an interconnect line $B_1$. The second input $IN_1$ of each multiplexer connects to a respective one of data terminals $DAT_0$ $DAT_1$, and $DAT_2$; the select terminals SEL connect to a control circuit 170 via respective enable lines $EN_0$, $EN_1$, and $EN_2$. Applying appropriate control signals to multiplexers 160, control circuit 170 connects one of data terminals $DAT_{0-2}$ to an interconnect line $B_2$, the output of the last multiplexer.

Chain 150 is functionally similar to bus structure 100 of FIG. 1A, passing only one data signal at a time to avoid contention. Taking terms borrowed from tri-state buffers, an "enabled" multiplexer transmits the input signal on its respective input terminal $IN_1$, while a "disabled" multiplexer transmits the input signal on its respective input terminal $IN_0$. Disabling all of multiplexers 160 connects an input terminal 165 to interconnect B2, whereas enabling any one of multiplexers 160 connects the respective one of data terminals $DAT_{0-2}$, to interconnect B2. For more information and detail on how multiplexer chain 150 implements bus structure 100, see U.S. Pat. No. 5,847,580 issued to Bapat et al.

When multiplexer chain 150 is used in high-speed systems requiring very low timing tolerances, the time required for the multiplexers to switch between enabled and disabled states becomes a critical component of the timing parameters of multiplexer chain 150. There is therefore a need for a way to characterize the speed performance of multiplexer chain 150 and similar circuits.

Among the myriad types of ICs, perhaps none requires more stringent speed characterization than field-programmable gate arrays (FPGAs). As is well known, FPGAs include various types of programmable logic and interconnect resources that can be programmably interconnected to form complex, user-specified designs. FPGA designers use "speed files" that include resistance and capacitance values for the various delay-inducing elements and combine them to establish delays for desired signal paths. These delays are then used to predict circuit timing for selected circuit designs implemented as FPGA configurations. FPGA timing parameters are assigned worst-case values to ensure FPGA designs work as indicated.

FPGA manufacturers would like to guarantee the highest speed performance possible without causing ICs to fail to meet the guaranteed timing specifications. More accurate measurements of circuit timing allow IC designers to use smaller guard bands to ensure correct device performance, and therefore to guarantee higher speed performance. There is therefore a need for a more accurate means of characterizing IC speed performance.

Recent advances in IC test methodologies, particularly important in the field of programmable logic, employ ring oscillators to characterize speed performance. In general, a number of components are configured in a loop so they together form a free-running ring oscillator. The oscillation period of the oscillator is then a measure of the combined delays through the oscillator's constituent components. Different oscillator configurations have been developed to characterize different circuit features, different circuit parameters, and the effects of different types of signal edges (e.g., rising vs. falling signal transitions). For an example of a ring-oscillator configuration that measures some forms of signal propagation delays in FPGAs, see U.S. Pat. No. 6,075,418 issued to Kingsley et al., which is incorporated herein by reference.

Oscillator test configurations work well to characterize speed performance, but have not been adapted for use with some important types of circuit configurations. They have not been applied, for example, to multiplexer chain 150 described above in connection with FIG. 1B. As a consequence, there remains a need for a means of precisely characterizing some forms of multi-input combinatorial logic circuits, including multiplexer chain 150.

SUMMARY

The present invention gives an accurate means of characterizing the speed performance of multi-input combinatorial logic circuits. Some embodiments are particularly useful for testing programmable logic devices, which can easily be programmed to include the requisite test circuitry.

In accordance with one embodiment, a number of synchronous components are configured in a loop so that they together form a free-running ring oscillator. One or more multi-input combinatorial logic circuits is inserted into the loop so the oscillator produces a periodic signal having a period based, in part, on the delay through the combinatorial logic components. The delay through the combinatorial logic can therefore be derived from the period.

Synchronous components and combinatorial logic can exhibit different responses to rising and falling signal edges. Embodiments of the invention therefore separately assess these responses to better characterize multi-input combinatorial logic. In some embodiments in which the multi-input combinatorial logic circuits emulate tri-state buffers, the responses to rising and falling edges characterize the speed at which these logic circuits enable and disable certain signal paths.

This summary does not limit the invention, which is instead defined by the allowed claims.

DETAILED DESCRIPTION

Figure 2:
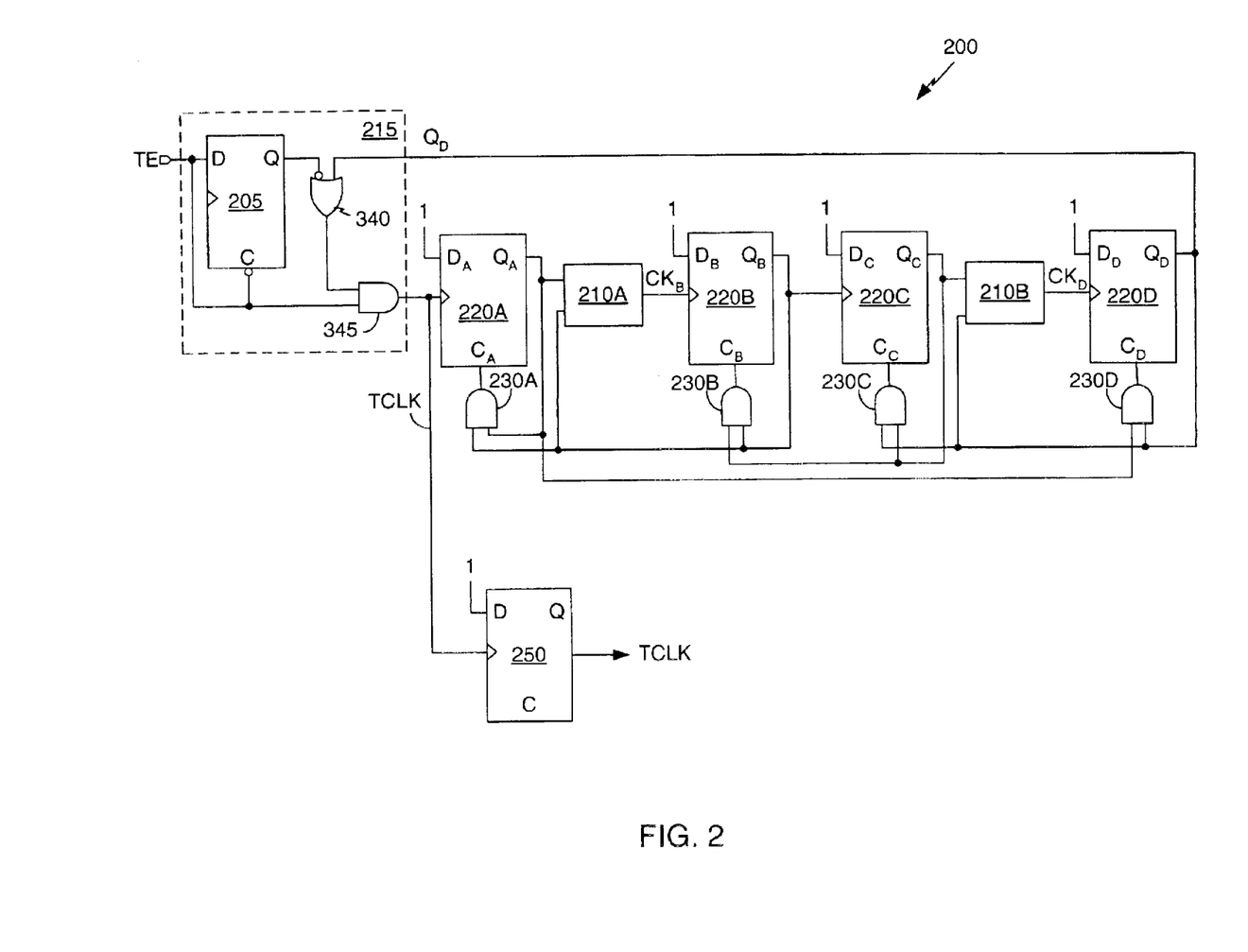
FIG. 2 is a schematic diagram of an oscillator 200 configured to produce a test-clock signal TCK for which the period $T_{TCK}$ includes the combined delays of flip-flops 220A–220D of FIG. 2 and a pair of test circuits 210A and 210B for rising edges.

FIG. 2 is a schematic diagram of an oscillator 200 in accordance with an embodiment of the invention. Oscillator 200 generates an oscillating test signal having a period that includes the clock-to-out delays of four synchronous components and the delays through a pair of multi-input combinatorial logic circuits 210A and 210B. Oscillator 200 is similar to one described in the above-referenced patent to Kingsley et al., but is adapted to test multi-input combinatorial logic circuits.

Oscillator 200 includes an oscillator-enable circuit 215 transmitting a test-clock signal TCLK to a four-stage ring oscillator. The ring oscillator includes flip-flops 220A–220D, AND gates 230A–230D, and first and second test circuits 210A and 210B. AND gates 230A–D are flip-flop clear circuits adapted to clear each respective flip-flop when it and the next flip-flop is set. For example, AND gate 230A clears flip-flop 220A when flip-flops 220A and 220B are both set (e.g., both store logic ones). Before starting a test cycle, a global set/reset signal (not shown) is temporarily asserted, clearing the flip-flops of FIG. 2 to reset their respective "Q" outputs to a logic zero. An additional flip-flop 250, identical to flip-flop 220A, minimizes the loading effect of test-clock line TCLK so that the clock-to-out timing of flip-flops 210A–210D is accurately represented by the oscillation period of oscillator 200.

In response to a logic one presented on test-enable terminal TE, circuit 215 transmits a positive pulse to the clock terminal of flip-flop 220A, causing oscillator 200 to begin oscillating. Returning test-enable signal TE to logic zero turns oscillator 200 off.

Each flip-flop includes a data terminal D connected to a logic one (e.g., VDD), a clock terminal, a synchronous output terminal Q, and an asynchronous clear terminal C. Test circuits 210A and 210B, identical circuits in the depicted embodiment, are two-input combinatorial logic circuits. Test circuit 210A behaves in the manner expressed in the following truth table:

| Truth Table for Circuit 210A | |
|---|---|
| $Q_A$ | $CK_B$ |
| 0 | $Q_B$ |
| 1 | 1 |

The foregoing truth table is sufficient to explain the operation of oscillator 200. An embodiment of test circuit 210A is detailed below in connection with FIG. 4.

Figure 3:
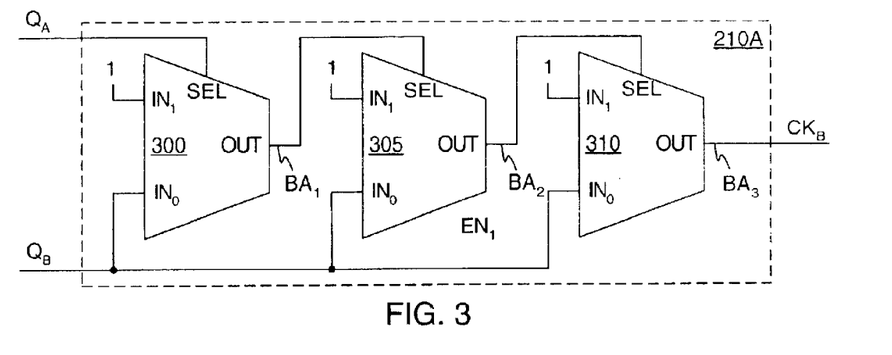
FIG. 3 details test circuit 210A of FIG. 2.

FIG. 3 details an embodiment of test circuit 0.210A, which is similar to multiplexer chain 150 of FIG. 1B. Test circuit 210A includes three multiplexers 300, 305, and 310 connected in a chain. Each multiplexer includes a select terminal SEL, a pair of input terminals $IN_0$ and $IN_1$, and an output terminal OUT. As is conventional, the logic level on a given select terminal SEL directs the signal on the corresponding input terminal to the output terminal. For example, a logic one on line $Q_A$ connects input terminal $IN_1$ to line $BA_1$, and a logic zero on line $Q_A$ connects input terminal $IN_0$ to line $BA_1$. Test circuit 210A includes three multiplexers in this embodiment, but may include more or fewer. The first multiplexer 300 provides its output $BA_1$ to the select terminal of the intermediate multiplexer 305, which in turn provides its output $BA_2$ to the select terminal of the last multiplexer 310. The final output $BA_3$ from multiplexer 310 is connected to the clock terminal $CK_B$ of flip-flop 220B (FIG. 2).

As detailed below, rising edges on the select terminal SEL of multiplexer 300 propagate through all three multiplexers to produce a rising edge on the output of test circuit 210A. The time required for the rising edge to propagate through circuit 210A is a measure of the average switching speed of the three multiplexers, and is consequently useful in characterizing test circuit 210A. In embodiments in which test circuit 210A is to be used as a tri-state buffer of the type discussed above in connection with FIG. 1B, the signal propagation delay through test circuit 210A is a measure of the speed at which test circuit 210A is disabled. (A second test configuration, detailed below, provides a measure of the speed at which test circuit 210A is enabled.)

Figure 4:
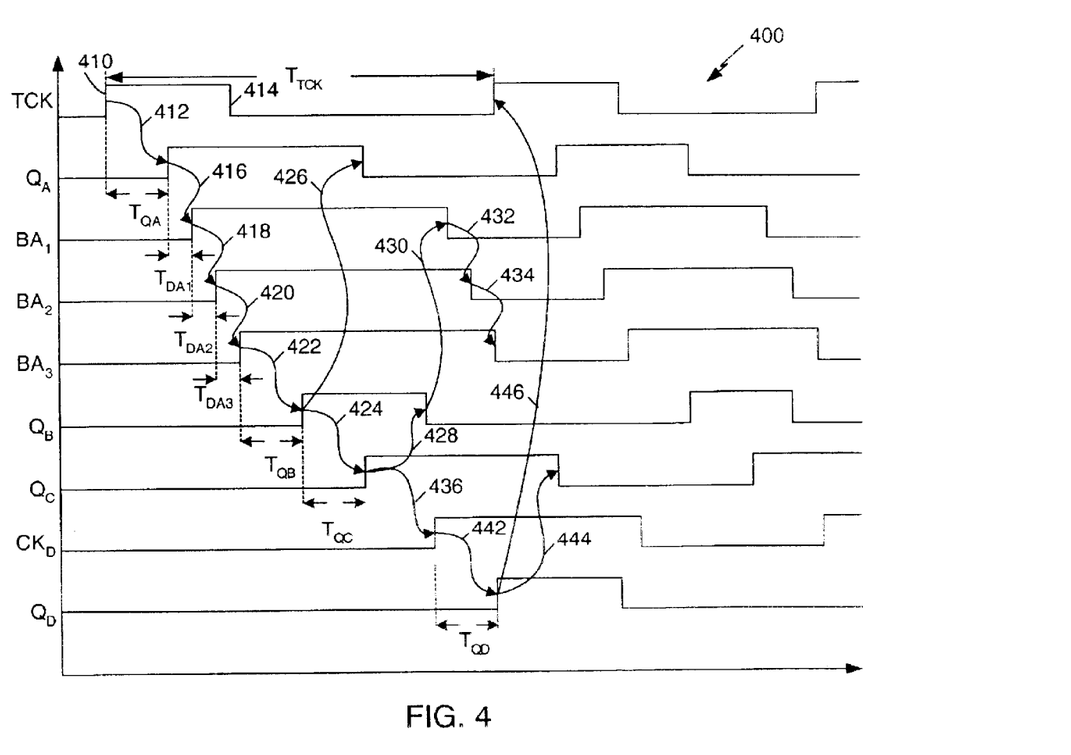
FIG. 4 is a waveform diagram depicting the operation of oscillator 200 of FIG. 2.

FIG. 4 is a waveform diagram 400 depicting the operation of oscillator 200 of FIG. 2. Each waveform in FIG. 4 is labeled using the corresponding signals depicted in FIGS. 2 and 3. Flip-flops 230A–D are reset prior to asserting the test-enable signal TE, so output terminals $Q_A$, $Q_B$, $Q_C$, and $Q_D$ are initially low.

Asserting test-enable signal TE (FIG. 2) induces a rising edge 410 on the clock input of flip-flop 220A. Flip-flop 220A responds by transmitting a logic one from input terminal $D_A$ to synchronous output terminal $Q_A$. This response occurs after a clock-to-out delay $T_{QA}$ associated with flip-flop 220A (arrow 412). The rising edge of signal $Q_A$ causes multiplexer 300 (FIG. 3) to connect input terminal $IN_1$ to the respective output terminal, thereby producing a rising edge on of signal $BA_1$ after the clock-to-out disable time $T_{DA1}$ associated with the first multiplexer of test circuit 350A (arrow 416). Though not shown, the Q output of flip-flop 205 also goes high, and the resulting rising edge produces a falling edge 414 to the clock input of flip-flop 220A via an OR gate 340 and AND gate 345. Flip-flop 220A, a positive-edge-triggered flip-flop, is unaffected by falling edge 414. Falling edge 414 is important, however, because it prepares flip-flop 220A to respond to a subsequent rising edge of signal $Q_D$.

The rising edge of signal $BA_1$ causes intermediate multiplexer 305 to connect its input terminal $IN_1$ to the respective output terminal, thereby producing a rising edge on of signal $BA_2$ after the clock-to-out disable time $T_{DA2}$ (arrow 418). The rising edge of signal $BA_2$ then causes final multiplexer 310 to connect its input terminal $IN_1$ to the respective output terminal, thereby producing a rising edge on of signal $BA_3$ after the clock-to-out disable time $T_{DA3}$ (arrow 420). The rising edge from flip-flop 220A thus traverses test circuit 210A to clock flip-flop 220B.

Clocking flip-flop 220B produces a rising edge on output terminal $Q_B$ after the clock-to-out delay $T_{QB}$ of flip-flop 220B (arrow 422). With both flip-flops 210A and 210B providing logic ones to AND gate 230A, the clear terminal $C_A$ goes high, clearing flip-flop 220A (arrow 426). There being no intervening component between flip-flops 220B and 220C, the rising edge from flip-flop 210B clocks the subsequent flip-flop 210C after the clock-to-out delay $T_{QC}$ of flip-flop 220C (arrow 424).

The rising edge of signal $Q_C$, together with signal $Q_B$ on the input terminals of AND gate 230B, clears flip-flop 220B returning signal $Q_B$ to a logic zero (arrow 428). The logic zero signal $Q_B$, in turn, traverses multiplexer 300 to return signal $BA_1$ to logic zero (arrow 430). The falling edge then propagates through the remaining multiplexers 305 and 310 to produce a logic zero on the clock input $CK_B$ to flip-flop 220B (arrows 432 and 434). Returning to signal $Q_C$, the rising edge of that signal additionally traverses test circuit 210B to the clock input $CK_D$ of flip-flop 220D (arrow 436). Test circuit 210B is identical to test circuit 210A in this example, so a detailed treatment of test circuit 210B is omitted for brevity.

The rising edge of signal $CK_D$ clocks flip-flop 220D, which consequently transmits a logic one on terminal $Q_D$ (arrow 442) after clock-to-out delay $T_{QD}$. The rising edge clears flip-flop 230C (arrow 444) and produces a new rising edge on the clock input of flip-flop 220A via test-enable circuit 215 (arrow 446). This second rising edge on the clock terminal of flip-flop 220A propagates in the same manner as the first, stimulating yet another rising edge. In this way, oscillator 200 continues to send rising and falling edges through flip-flops 220A–D and test circuits 210A and 210B for as long as the test enable signal TE is asserted.

Cycling edges through flip-flops 220A–220D produces an oscillating test-clock signal TCK whose period $T_{TCK}$ includes the sum of the rising edge clock-to-out delays of flip-flops 220A–220D ($T_{QA}$, $T_{QB}$, $T_{QC}$, and $T_{QD}$) and select delays of test circuit 210A and 210B. In embodiments in which test circuits 210A and 210B substitute for tri-state buffers in the manner discussed in the foregoing background section, the select delays are referred to as the "disable" delays, as they express the time required for the multiplexers to disable the data path provided by input terminal $IN_0$.

The period $T_{TCK}$ averaged over many cycles provides a precise measure of the total propagation delay for rising edges through flip-flops 220A–D, test circuits 210A and 210B, and the related interconnect. The delay contributions of flip-flops 210A–D and the interconnect can be measured independently, using an oscillator similar to oscillator 200 but lacking test circuits 210A and 210B, for example. Subtracting these delay contributions from period $T_{TCK}$ and dividing the difference by the total number of multiplexers in test circuits 210A and 210B then yields the average select delay of the constituent multiplexers 300, 305, and 310.

The time required for the multiplexers to switch from input $IN_0$ to input $IN_1$ may differ from the time required to switch from input $IN_1$ to input $IN_0$. Some embodiments therefore include test circuits that provide measures of both types of delay.

Figure 5A:
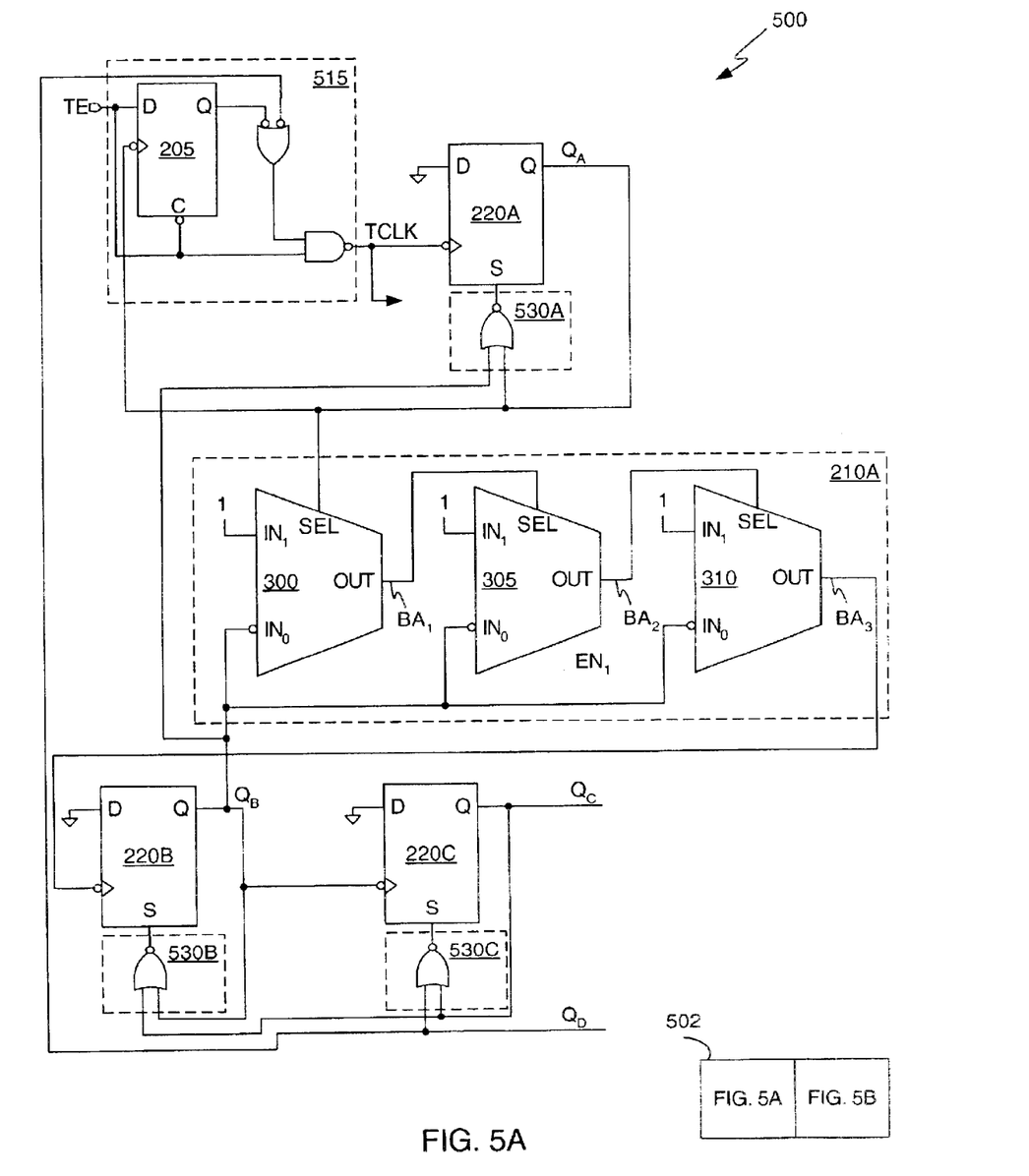
FIGS. 5A and 5B depicts an oscillator 500 configured to produce a test-clock signal TCK for which the period $T_{TCK}$ includes the combined delays of flip-flops 220A–220D and test circuits 210A and 210B for falling edges.
Figure 5B:
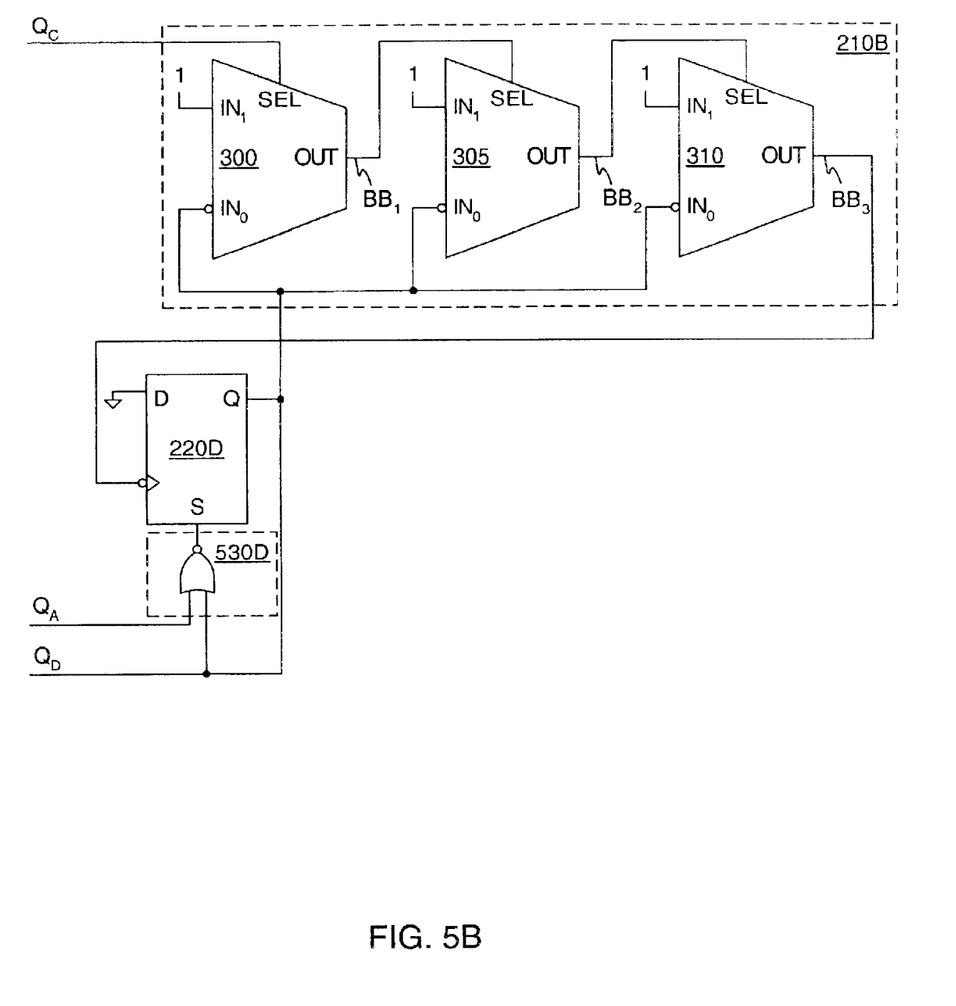

FIGS. 5A and 5B depict an oscillator 500 configured to produces a test-clock signal TCLK for which the period $T_{TCK}$ includes the falling-edge delays through the components of oscillator 200 of FIG. 2. A key 502 illustrates the relationship between FIGS. 5A and 5B. In embodiments in which test circuit 210A is of the type discussed above in connection with FIG. 1B, the signal propagation delay through test circuit 210A of FIG. 5 is a measure of the speed at which test circuit 210A is enabled.

Oscillator 500 includes a test-enable circuit 515 adapted to initiate oscillation by providing successive falling and rising edges on test clock terminal TCLK and then feeding back the output $Q_D$ from flip-flop 220D to the clock terminal of flip-flop 220A. To configure the flip-flops to respond to falling edges, the D inputs are connected to a logic voltage level representative of a logic zero and the clock terminals are inverted (i.e., are negative-edge triggered). Test circuits 210A and 210B are as described in FIG. 3 except that the input terminals IN0 are inverted. The interconnect used in oscillator 500 is similar to that of oscillator 200. Oscillator 500 additionally includes a collection of NOR gates 530A–D that provides feedback to prepare the flip-flops to respond to subsequent falling edges.

Prior to oscillation, flip-flop 205 is cleared and each of flip-flops 220A–D set. A logic one on test-enable terminal TE then produces a falling edge on line TCLK to initiate oscillation. The falling edge clocks flip-flop 220A, bringing output terminal $Q_A$ from high to low. This falling edge propagates through test circuit 210A to clock flip-flop 220B. The resulting logic zero on output terminal QB resets flip-flop 220A via a NOR gate 530A, preparing flip-flop 220A to respond to a subsequent falling edge. Flip-flops 220B–D react to falling edges in the same manner as flip-flop 220A, and therefore propagate the test clock signal back to flip-flop 220A via test-enable circuit 515.

Cycling a pulse through flip-flops 220A–220D produces an oscillating test-clock signal TCLK whose period $T_{TCK}$ includes the sum of the falling edge clock-to-out delays of flip-flops 220A–220D and the select delays of test circuit 210A and 210B. In embodiments in which test circuits 210A and 210B substitute for tri-state buffers in the manner discussed in the foregoing background section, the select delays are referred to as the "enable" delays, as they express the time required for the multiplexers to enable the data path provided by input terminal $IN_0$.

The period $T_{TCK}$ averaged over many cycles provides a precise measure of the total propagation delay for falling edges through flip-flops 220A–D, test circuits 210A and 210B, and the related interconnect. The delay contributions from flip-flops 210A–D and the interconnect can be measured independently, using an oscillator similar to oscillator 200 but lacking test circuits 210A and 210B, for example. Subtracting these delay contribution from period $T_{TCK}$ and dividing the difference by the total number of multiplexers in test circuits 210A and 210B then yields the average select delay of the constituent multiplexers 300, 305, and 310.

While the present invention has been described in connection with specific embodiments, variations of these embodiments will be obvious to those of ordinary skill in the art. For example, one could replace the multiplexers with special-purpose structures on an FPGA, such as embedded RAM, embedded multipliers, etc. Also, while each stage of the above-described ring oscillators includes a sequential storage element, ring-oscillator stages can also be formed using combinatorial logic. Moreover, some components are shown directly connected to one another while others are shown connected via intermediate components. In each instance the method of interconnection establishes some desired electrical communication between two or more circuit nodes, or terminals. Such communication may often be accomplished using a number of circuit configurations, as will be understood by those of skill in the art. Therefore, the spirit and scope of the appended claims should not be limited to the foregoing description.

What is claimed is:

1. A system for determining clock-to-out enable delay and clock-to-out enable delay and clock-to-out disable delay of a first test circuit, the system comprising: a ring oscillator having at least first and second ring-oscillator stages, wherein the first ring-oscillator stage includes a first input terminal and a first output terminal, and the second ring-oscillator stage includes a second input terminal and a second output terminal; and an oscillator enable circuit having a test enable input terminal coupled to the ring oscillator, the oscillator enable circuit for enabling oscillation of the ring oscillator responsive to the test enable input terminal; wherein the first test circuit is interposed between the first stage and the second stage, the first test circuit having a first test input terminal connected to the first output terminal, a second test input terminal connected to the second output terminal, and a first test output terminal connected to the second input terminal.

2. The system of claim 1, wherein the first and second output terminals transmit respective first and second signals and the first test output terminal transmits a first test signal.

3. The system of claim 1, the ring oscillator further comprising third and fourth ring-oscillator stages, wherein the third ring-oscillator stage includes a third input terminal receiving the second output signal and a third output terminal, and the fourth ring-oscillator stage includes a fourth input terminal and a fourth output terminal.

4. The system of claim 3, the system further comprising a second test circuit interposed between the third stage and the fourth stage, the second test circuit having a third test input terminal connected to the third output terminal, a fourth test input terminal connected to the fourth output terminal, and a second test output terminal connected to the fourth input terminal.

5. The system of claim 4, wherein the third and fourth output terminals transmit respective third and fourth output signals and the second test output terminal transmits a second test signal.

6. The system of claim 4, wherein each of the first, second, third, and fourth ring-oscillator stages includes a respective first, second, third, and fourth synchronous components, each synchronous component having:
a. a clock terminal,
b. a synchronous input terminal,
c. an asynchronous input terminal, and
d. an output terminal.

7. The system of claim 6, wherein the synchronous components comprise flip-flops.

8. The system of claim 6, wherein at least one of the asynchronous input terminals is a clear terminal.

9. The system of claim 6, wherein the synchronous input terminals connect to a voltage representative of a logic one.

10. The system of claim 6, wherein the synchronous input terminals connect to a voltage representative of a logic zero.

11. The system of claim 6, wherein the first, second, third and fourth input terminals are clock terminals.

12. The system of claim 3, the ring oscillator further comprising a plurality of logic circuits, the plurality of logic circuits including:
a. a first of the plurality of logic circuits receiving the first and second output signals and providing a first clear signal to the first synchronous component;
b. a second of the plurality of logic circuit receiving the second and third output signals and providing a second clear signal to the second synchronous component;
c. a third of the plurality of logic circuit receiving the third and fourth output signals and providing a third clear signal to the third synchronous component; and
d. a fourth of the plurality of logic circuit receiving the fourth and first output signals and providing a fourth clear signal to the fourth synchronous component.

13. The system of claim 11, wherein each of the first, second, third, and fourth logic circuits includes an AND gate.

14. The system of claim 4, wherein the ring oscillator, the plurality of logic circuits, first, and second test circuits are instantiated on a field-programmable gate array having configurable logic elements and configurable interconnect resources, the first and second test circuits each further comprising at least one multiplexer programmably connected to the interconnect resources, the first multiplexer including:
a. a multiplexer control terminal receiving the first test input signal;
b. a first multiplexer input connected to a constant voltage; and
c. a second multiplexer input connected receiving the second test input signal; and
d. a multiplexer output terminal connected to the test output terminal.

15. The system of claim 14, wherein the first multiplexer output connects to a first interconnect resource, the first interconnect resource forming a first programmable bus line.

16. The system of claim 15, wherein the multiplexer is a first multiplexer.

17. The system of claim 16, the first and second test circuits each further comprising a intermediate multiplexer, the intermediate multiplexer having:
a. the multiplexer control programmably connected to the first interconnect resource;
b. a first multiplexer input connected to a constant voltage;
c. the second multiplexer input receiving the second test input signal; and
d. the multiplexer output terminal transmitting the multiplexer output signal to an intermediate interconnect resource, the intermediate interconnect resource forming an intermediate programmable bus line.

18. The system of claim 17, the first and second test circuits each further comprising a last multiplexer, the last multiplexer having:
a. the multiplexer control programmably connected to the intermediate interconnect resource;
b. a first multiplexer input connected to a constant voltage;

c. the second multiplexer input receiving the second test input signal; and d. the multiplexer output terminal transmitting the multiplexer output signal to a last interconnect resource, the intermediate interconnect resource forming a last programmable bus line.

19. The system of claim 18, wherein the constant voltage is a voltage value representative of a logic one.

20. A method for measuring enable and disable delay time for a test circuit to switch between transmitting a signal on an input node and a second logic level in response to signal transition on a control terminal, wherein a rising edge signal transition on the control terminal disables the test circuit and a falling edge transition on the control terminals enables the test circuit, the method comprising:

a. providing a first synchronous signal transition on the control terminal, the first synchronous signal transition changing the logic level on the control terminal from the first logic level to the second logic level;

b. receiving an output signal transition on the output node of the test circuit in response to the signal transition on the control terminal, wherein the output signal transition is delayed by the disable delay time;

c. generating, in response to the output signal,
  i. an asynchronous signal transition on the control node of the test circuit to return the control and input nodes to the first logic level;
  ii. a second synchronous signal transition on the input node of the test circuit to generate, after the signal disable delay time, a second output signal transition; and d. measuring the period between successive synchronous signal transitions on the output node of the test circuit.

21. The method of claim 20, wherein the signal transition is a rising edge of a logic signal.

22. The method of claim 20, wherein the signal transition is a falling edge of a logic signal.

* * * * *